US006838010B2

(12) United States Patent
Grasshoff et al.

(10) Patent No.: US 6,838,010 B2
(45) Date of Patent: Jan. 4, 2005

(54) SYSTEM AND METHOD FOR WAFER-BASED CONTROLLED PATTERNING OF FEATURES WITH CRITICAL DIMENSIONS

(75) Inventors: Gunter Grasshoff, Radebeul (DE); Carsten Hartig, Meerane (DE)

(73) Assignee: Advanced Micro Devices, Inc., Austin, TX (US)

(*) Notice: Subject to any disclaimer, the term of this patent is extended or adjusted under 35 U.S.C. 154(b) by 296 days.

(21) Appl. No.: 10/128,662

(22) Filed: Apr. 22, 2002

(65) Prior Publication Data
US 2003/0015493 A1 Jan. 23, 2003

(30) Foreign Application Priority Data
Jul. 17, 2001 (DE) .......................... 101 34 756

(51) Int. Cl.[7] .............................. G01L 21/30
(52) U.S. Cl. ..................... 216/59; 216/60; 216/66; 438/7; 438/706
(58) Field of Search ..................... 216/58, 59, 60, 216/66; 438/7, 9, 706, 710, 712, 720

(56) References Cited

U.S. PATENT DOCUMENTS

| 5,629,772 A | 5/1997 | Ausschnitt ............... 356/372 |
| 5,655,110 A | 8/1997 | Krivokapic et al. ........ 395/500 |
| 5,773,174 A | 6/1998 | Koizumi et al. ............. 430/30 |
| 5,902,704 A | 5/1999 | Schoenborn et al. ........... 430/5 |
| 5,926,690 A | 7/1999 | Toprac et al. ................ 438/17 |
| 6,030,732 A | 2/2000 | Liu ............................ 430/30 |
| 6,342,704 B1 * | 1/2002 | Jen et al. ................. 250/559.4 |
| 6,545,753 B2 * | 4/2003 | Subramanian et al. ... 356/237.5 |

FOREIGN PATENT DOCUMENTS

| DE | 19922614 A1 | 6/2000 |
| EP | 0 883 030 A2 | 12/1998 |

OTHER PUBLICATIONS

Hankinson et al., "Integrated Real–time and Run–to–Run Control of Etch Depth in Reactive Ion Etching," Mar. 13, 1996, pp. 1–17.

Boning et al., "Practical Issues in Run by Run Process Control," 1995 IEEE/SEMI Advanced Manufacturing Conference, 1995, pp. 201–208.

Zafiriou et al., "Nonlinear Model Based Run–to–Run Control for Rapid Thermal Processing with Unmeasured Variable Estimation," 187th ECS Meeting, Reno, NV, May 1995.

Boning et al., "Run by Run Control of Chemical–Mechanical Polishing," IEEE/CHMT International Electronics Manufacturing Technology Symposium, Austin, TX, Oct. 2–4, 1995.

Smith et al., "Compensating for CMP Pad Wear Using Run by Run Feedback Control," VMIC. Santa Clara, CA, Jun. 18–20, 1996.

Sachs et al., "Process Control System for VLSI Fabrication," IEEE Transactions on Semiconductor Manufacturing, Apr. 5, 1990, pp. 1–31.

* cited by examiner

Primary Examiner—Lan Vinh
(74) Attorney, Agent, or Firm—Williams, Morgan & Amerson, P.C.

(57) ABSTRACT

In a system and a method for controlling critical dimensions of features to be formed on a substrate, a measurement device is coupled to an etch tool to form a feedback loop to control the critical dimensions on a wafer basis instead of a lot basis. In a further embodiment, the etch tool is in communication with a control unit that allows controlling of the etch tool and/or of the photolithography tool on the basis of an etch model. Thus, variations within a lot may be compensated by a software implementation of the etch model. The control unit may be implemented in the etch tool or an external device.

41 Claims, 3 Drawing Sheets

SYSTEM AND METHOD FOR WAFER-BASED CONTROLLED PATTERNING OF FEATURES WITH CRITICAL DIMENSIONS

BACKGROUND OF THE INVENTION

1. Field of the Invention

The present invention relates to the field of fabrication of integrated circuits, and, more particularly, to the formation of features having critical dimensions, such as gate electrode structures, in modem ultra high density integrated circuits.

2. Description of the Related Art

Fabrication of integrated circuits requires tiny regions of precisely controlled size to be formed in a material layer of an appropriate substrate, such as a silicon substrate. These tiny regions of precisely controlled size are generated by treating the material layer by means of, for example, ion implantation or etching, wherein a mask layer is formed over the material layer to be treated to define these tiny regions. A particularly critical step in defining such tiny regions is, for example, the formation of gate electrodes of field effect transistors. Such gate electrodes are substantially comprised of a polycrystalline silicon feature line having a lateral dimension of 0.18 $\mu$m and smaller in modem integrated circuits.

In general, the mask layer used for patterning device features may consist of or is formed by means of a layer of photoresist that is patterned by a lithographic process. During the lithographic process, the resist may be spin coated onto the wafer substrate, and is then selectively exposed to ultraviolet radiation. After developing the photoresist, depending on the type of resist, positive resist or negative resist, the exposed portions or the non-exposed portions of the photoresist are removed to form the required pattern in the photoresist layer. Since the dimensions of the patterns in modern integrated circuits are steadily decreasing, the equipment used for patterning device features have to meet very stringent requirements with regard to resolution of the involved processes for forming these features. In this respect, resolution is considered as a measure specifying the consistent ability to print minimum-size images under conditions of predefined manufacturing variations. Since printing of features onto a substrate requires a plurality of interrelated processes, such as coating the substrate with a photoresist exhibiting defined optical characteristics as well as a defined resistance to an etchant, exposing the substrate to radiation, developing the exposed photoresist, wherein developing involves various tempering steps, and etching the substrate (for example, when forming gate electrodes), the resolution of features, i.e., a minimum distance between adjacent features or a minimal feature width, is not exclusively determined by the quality of the imaging process, but also by the subsequent etch process, especially when features are formed, having dimensions less than the wavelength of the radiation used for irradiating the photoresist.

One important factor in improving the resolution is represented by the lithographic process, in which patterns contained in a photo mask or reticle are optically transferred to the substrate via an optical imaging system. Therefore, great efforts are made to steadily improve optical properties of the lithographic system, such as numerical aperture, depth of focus, and wavelength of the light source used.

The quality of the lithographic imagery is extremely important in creating very small feature sizes. Of comparable importance is, however, the accuracy with which an image can be positioned on the surface of the substrate. Integrated circuits are fabricated by sequentially patterning material layers, wherein features on successive material layers bear a spatial relationship to one another. Each pattern formed in a subsequent material layer has to be aligned to a corresponding pattern formed in the previous material layer within specified registration tolerances. These registration tolerances are caused by, for example, a variation of a photoresist image on the substrate due to non-uniformities in such parameters as resist thickness, baking temperature, exposure intensity and development characteristics. Furthermore, non-uniformities in the etch processes may lead to variations of the etched features. Modem integrated circuits are designed to include gate electrodes having a lateral dimension, also referred to as gate length, that is comparable to and even smaller than the wavelength of the photolithography tool used. To this end, a so-called trim etch process is employed to form features of lateral dimensions beyond the optical resolution, which significantly contributes to the overall resolution of the patterning process thus playing a dominant role for the quality of the features formed.

Accordingly, it is essential to steadily monitor the resolution, i.e., the capability of reliably and reproducibly creating the minimum feature size, also referred to as critical dimension (CD), within a specific material layer. To this end, typically, two or three wafers per lot, having formed thereon a photoresist pattern, are subjected to a scanning electron microscope analysis (SEM) to monitor the quality of the imaging process including photoresist treatment and development parameters. The analysis may yield measurement results regarding resist uniformity, critical dimensions of the resist features, steepness of the sidewalls of resist feature lines, and the like. Additionally, two or three wafers per lot are subjected to SEM analysis after completion of the etch process to monitor the overall resolution, i.e., the critical dimension, of the patterning process. Depending on the results of these measurements, the parameter values of the parameters defining the photolithography step and the etch process may be correspondingly re-adjusted to try maintaining the critical dimensions within allowed tolerances set by the design rules. Owing to gathering information on the quality of the patterning process in a random test-like fashion, process variations can at best be compensated on a lot basis, for example, by re-adjusting corresponding process parameters, wherein variations within a lot due to variations within the substrates or changes of the process tools are not detectable.

Since the quality of features with critical dimensions, such as gate electrodes, is important for the entire device in view of functionality as well as with respect to economical reasons (throughput), it is highly desirable to improve the process of patterning of features with critical dimensions with respect to both accuracy and robustness of the patterning process.

SUMMARY OF THE INVENTION

According to one aspect of the present invention, a system for controlling critical dimensions of features to be formed on a substrate comprises an etch tool adapted to establish a parameter-specified etch ambient for etching the substrate. Moreover, the system comprises a measurement device operatively coupled to the etch tool, wherein the measurement device is adapted to generate a detection signal representative of critical dimensions of features formed on the substrate. Additionally, the system comprises a control unit in communication with the measurement device to receive the detection signal, wherein the control unit is adapted to indicate, on the basis of the detection signal, information related to at least one parameter determining the parameter-specified etch ambient.

According to a further embodiment, a system for controlling critical dimensions of features to be formed on a substrate comprises an etch tool adapted to establish a parameter-specified etch ambient for etching the substrate upon receipt of a control signal, and a control unit to provide the control signal. The system further comprises a parameter evaluation unit to determine, on the basis of a model parameter value, at least one parameter value defining the parameter-specified etch ambient to control the critical dimensions in conformance with design requirements, and a communication channel connecting the control unit and the parameter evaluation unit.

According to a further aspect, an etch tool for patterning a substrate with features having critical dimensions comprises a substrate handling device to receive and to output the substrate, and a process chamber operatively coupled to the substrate handling device and adapted to establish a parameter-specified reactive plasma ambient in response to a control signal. Moreover, the etch tool comprises a control unit operatively coupled to the substrate handling device and the process chamber to control operation of the substrate handling device and to provide the control signal to the process chamber, wherein the control unit determines, on the basis of a model parameter value, at least one of bias and etch time for the substrate to be processed.

According to a further embodiment, an etch tool for patterning a substrate with features of critical dimensions according to a photoresist mask formed on the substrate comprises a substrate handling device to receive and to output the substrate, and a process chamber operatively coupled to the substrate handling device and adapted to establish a parameter-specified reactive plasma ambient in response to a control signal. The etch tool further comprises a control unit operatively coupled to the substrate handling device and the process chamber to control operation of the substrate handling device and to provide the control signal to the process chamber. Additionally, the etch tool comprises a measurement device in communication with the control unit and positioned to detect at least one of the characteristics of the photoresist mask and the characteristics of features formed by the etch tool, wherein the control unit generates the control signal on the basis of said detected characteristics.

According to another aspect of the present invention, a method of controlling critical dimensions of features on a substrate comprises providing an etch tool adapted to establish a parameter-specified reactive ambient and providing a substrate having formed thereon a photoresist pattern in conformance with design requirements. The method further comprises providing a measurement device adapted to determine characteristics of features formed on the substrate, and exposing the substrate to the parameter-specified reactive ambient. Moreover, the method comprises measuring the substrate with the measurement device to obtain the characteristics of the features generated by exposing the substrate to the parameter-specified reactive ambient, and determining, at least on the basis of the obtained characteristics, at least one parameter to control the parameter-specified reactive ambient.

According to a further embodiment, a method of controlling critical dimensions of features on a substrate comprises providing an etch tool adapted to establish a parameter-specified reactive ambient in response to a control signal, and providing a substrate having formed thereon a photoresist pattern in conformance with design requirements. The method further comprises providing a control unit operatively coupled to the etch tool to control operation of the etch tool, determining at least one parameter value for the parameter-specified reactive ambient on the basis of at least one model parameter value, and communicating the determined at least one parameter value to the control unit. Additionally, the method comprises exposing the substrate to the parameter-specified reactive ambient; wherein the control unit controls the parameter-specified reactive ambient in accordance with the determined at least one parameter value.

BRIEF DESCRIPTION OF THE DRAWINGS

The invention may be understood by reference to the following description taken in conjunction with the accompanying drawings, in which like reference numerals identify like elements, and in which.

Figure 1A:
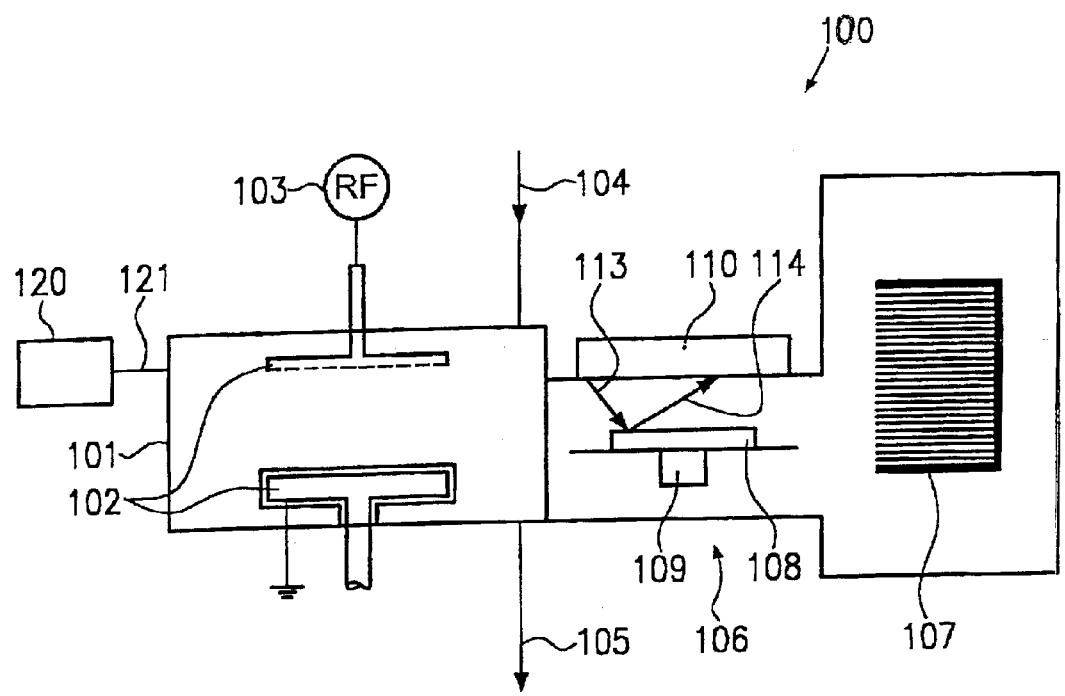
FIG. 1a schematically shows one illustrative embodiment of a system for controlling critical dimensions according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention is based on the inventors' concept to operatively couple a measurement device, such as an optical measurement device, to an etch tool that is capable to print features onto a surface of a substrate, wherein the measurement device gathers information on the quality of the printed features and to adjust at least one parameter defining the reactive ambient of the etch tool on the basis of the measurement result so as to establish a type of "feedback loop" on a single substrate basis. Alternatively, the at least one parameter may be controlled by a corresponding model parameter value that is externally or internally generated to maintain the critical dimensions within the design tolerances for each individual substrate processed or to be processed at the etch tool.

Figure 1B:
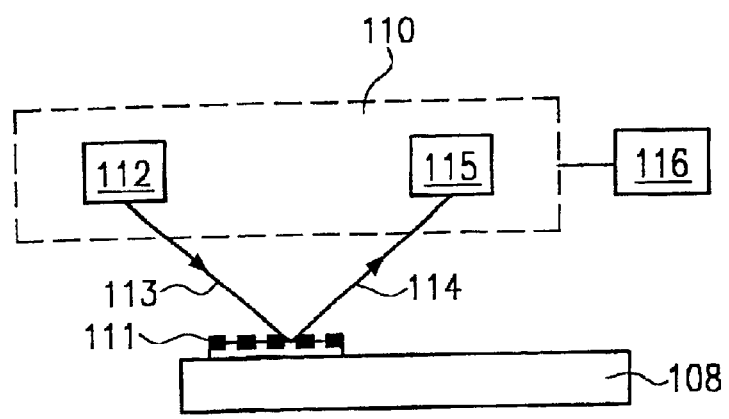
FIG. 1b schematically shows the optical measurement device used in the system of FIG. 1a in more detail.

With reference to FIGS. 1a and 1b, one illustrative embodiment in accordance with the present invention will now be described. In FIG. 1a, a system 100 for controlling critical dimensions of features to be formed on a substrate comprises a reaction chamber 101 accommodating a pair of electrodes 102, one of which is electrically connected to a radio frequency (RF) source 103, whereas the other electrode is coupled to a reference potential. A supply line 104 connects the reaction chamber 101 with a source of feed gases (not shown) and an exhaust line 105 establishes a fluid communication from the reaction chamber 101 to a pump station (not shown) including a pressure regulator. The reaction chamber 101, the electrodes 102, the RF source 103, the supply line 104 and the exhaust line 105, in combination, are adapted to establish a reactive etch ambient within the reactive chamber 101, wherein the reactive etch ambient is specified by a plurality of parameters, such as bias voltage applied to the electrodes 102, RF power provided by the RF source 103, flow rate of feed gases supplied via the supply line 104, pressure prevailing in the reaction chamber and generated by the pump station via the exhaust line 105, the temperature of the feed gases and the temperature at the location at which a substrate is to be positioned during operation of the system 100, and the like. Moreover, in this application the time period for which a substrate is exposed to the reactive ambient, herein below referred to as etch time, is also considered to be a parameter defining the reactive ambient.

The reaction chamber 101 is operatively coupled to a substrate handling device 106 comprising a loading mechanism 109 carrying a substrate 108 such as a semiconductor wafer as usually used in the manufacturing of modem integrated circuits. Within a storage area of the loading mechanism 109, a wafer cassette 107 accommodating one or more substrates may be inserted. An optical measurement device 110 is positioned to direct a light beam 113 onto the surface of the substrate 108 and to receive a light beam 114 reflected or scattered by the substrate 108. A control unit 120 is in communication with the reaction chamber 101 and the optical measurement device 110 via a communication channel 121. In one embodiment, the control unit 120 may be an external control unit connected to the reaction chamber 101 and to the optical measurement device 110 via appropriate communication cables well known in the art. In another embodiment, the control unit 120 may be an integral part of a control circuitry (not shown) controlling the operation of the reaction chamber 101. In still a further embodiment, the control unit 120 may be an integral part of electronics (not shown) of the optical measurement device 110.

In operation, the reactive ambient is established within the reaction chamber 101 by setting the parameter values of the parameters defining the reactive ambient in accordance with design requirements. That is, in the case where a polysilicon layer is to be patterned to form gate electrodes, the parameter values of the flow rates, the RF power, the pressure, the temperature, the bias, the etch time and the like are set to initial values in accordance with the manufacturing protocol. The loading mechanism 109 conveys the substrate 108 from the wafer cassette 107 to the reaction chamber 101 prior or after establishing the reactive ambient. During transport of the substrate 108 from the wafer cassette 107 to the reaction chamber 101, or during a short break in which the substrate 108 rests at a predefined position, the surface of the substrate 108 receives the light 113 and reflects or scatters the light beam to produce the reflected or scattered light beam 114.

In FIG. 1b, the optical measurement device 110 and the substrate 108 are illustrated in more detail. In FIG. 1b, the optical measurement device 110 is depicted to include a light source 112 adapted to output the light beam 113 with specified optical characteristics. In this respect, the optical characteristics may include the polarization state, the spectral intensity distribution, the total intensity, and the like of the light beam 113. A suitable light beam 113 may be provided by a light source such as an LED, a laser, a discharge lamp, and the like. In further illustrative embodiments, the light source 112 may be an integral part of a metrology tool such as an ellipsometer, a scatterometer, a laser scanner, and the like. Moreover, although the beam 113 and the scattered beam 114 are referred to as light beams, a further embodiment may employ any appropriate type of radiation, including particle beams. For example, the "light" source 112 may be adapted to output electromagnetic radiation, such as microwaves up to X-rays of several keV. Furthermore, the light source 112 may be adapted to provide an electron beam, such as in an SEM, or an ion beam with specified characteristics, such as average particle energy and intensity. In one particular embodiment, the light source 112 is adapted to output a light beam in the wavelength range of 800–1200 nm.

The optical measurement device 110 further comprises a light detector 115 to receive the light beam 114 and to detect at least one of the optical characteristics of the light beam 114. In one illustrative embodiment, the detector 115 comprises a polarizer (not shown) and a photodiode (not shown)

to analyze changes of the polarization state and the intensity with respect to the incident light beam 113. Furthermore, a control circuitry 116 is coupled to the detector 115 to generate a detection signal representing one or more optical characteristics of the light beam 114.

Moreover, the substrate 108 comprises a region bearing features 111, for example in the form of a plurality of feature lines separated by spaces to define a periodic pattern, onto which the incident light beam 113 is directed and by which the light beam is reflected and/or scattered to generate the light beam 114 received at the detector 115. The features 111 may represent a photoresist pattern generated by a photolithographic tool when the optical measurement device 110 measures the substrate 108 prior to being processed in the parameter-specified reactive ambient, or the features 111 may be etched features in combination with the remaining photoresist mask after the substrate 108 has been processed within the parameter-specified reactive ambient. The features 111 exhibit characteristics, such as width of a single feature line, also referred to as critical dimension, spacing between two adjacent features 111, angle of slope of sidewalls of the features 111, height of the features 111, and the like. The features 111 may be regular "product" features, i.e., features actually used for the semiconductor devices to be formed, such as gate electrodes of field effect transistors, or the features 111 may be formed on one or more specified positions, for example, in the scribe lines separating individual chip areas in the form of a grating, to define a test pattern that is generated in accordance with design rules and process steps in conformity with actual process features. In the embodiment illustrated in FIG. 1b, the features 111 define a periodic structure from which the incident light beam 113 having specified optical characteristics is scattered to create the light beam 114, the optical characteristics of which are changed with respect to the incident light beam 113 in accordance with the properties of the features 111 as explained above.

A signal obtained from the reflected or scattered light beam 114 is communicated to the analyzing circuitry 116 and may be further analyzed and processed by means well known in the art to generate the detection signal. For example, a variation of the polarization state and/or the spectral intensity of the scattered or reflected light beam 114 is detected and is compared with a reference data such as reference spectrum to thereby obtain information that is indicative for the critical dimensions of the features 111. The detector circuitry 116 generates the corresponding detection signal and communicates the detection signal to the control unit 120 via the communication channel 121.

According to an illustrative embodiment, the control unit 120 receiving the detection signal is adapted to indicate the measurement results to an external source such as an operator, a work station, or a global facility management system (FMS) that controls process flow in the facility according to a specified manufacturing protocol.

In one embodiment, the control unit 120 comprises a signal generation unit (not shown) to generate a control signal indicative for information related to the at least one parameter determining the parameter-specified ambient. Thereby, the control signal may represent a parameter value related to the actual critical dimensions, and/or a parameter difference related to a difference of the actually measured critical dimension and the desired critical dimension and/or a new to-be-adjusted parameter value required to readjust the reactive ambient so as to maintain the critical dimensions within the specified tolerances. The control signal supplied to the external sources may then be used to externally control the reactive ambient in the process chamber 101 or, according to a further embodiment, may be employed to monitor the status of the reaction chamber 101, wherein the control signal is communicated to the process chamber 101 via the communication channel 121 to directly control the reactive ambient.

Upon receiving the detection signal, the control unit 120 adjusts a value of at least one of the parameters specifying the reactive ambient in the reaction chamber 101. In one illustrative embodiment, the signal level of the detection signal represents the line width of the features 111 and the control unit 120 comprises a look-up table of parameter values that correspond to the different signal levels of the detection signal, wherein each parameter value/signal level pair is appropriately selected to control the reactive ambient so as to substantially maintain the critical dimensions within the design specifications. For example, the parameter values may specify the etch time for the substrate 108 and are assigned to respective signal levels such that signal levels indicating an increased critical dimension are related to correspondingly increased etch time values to compensate for any variations causing the increase of the critical dimensions. The parameter values in the look-up table may be adapted and/or verified, for example, by additional analysis, like an SEM analysis, such that each parameter value in the look-up table results in critical dimensions that are well within the specified tolerances. In one illustrative embodiment, the parameter values are steadily updated in a "self-consistent" fashion, wherein the critical dimensions caused by a specified parameter value used in the currently established reactive ambient is compared to a desired critical dimension. The parameter value under consideration that is, for instance, stored in a table, is then corrected if the difference of the actual critical dimensions and the desired critical dimensions exceeds a predefined threshold. In further embodiments other characteristics instead of the critical dimensions may be used, alternatively and additionally, such as the height of the features 111, the slope of the sidewalls, and the like. Furthermore, the signal level for conveying information containing the measurement results is an illustrative example. The detection signal may be a digital signal transferring the measurement information as digitally coded information.

According to a further illustrative embodiment, the measurement results of the critical dimensions of substrates, having been subjected to a measurement by the measurement device 110, may be stored to monitor any parameter drift of the reactive ambient. The value of the at least one parameter may then be accordingly controlled so as to minimize the deviation of the actual critical dimensions from the desired design value. It should be noted that the detection signals obtained from the substrate 108 prior to being processed in the reactive ambient and/or the detection signals obtained from the substrate 108, having already been processed in the reactive ambient, may be used as a basis for adjusting the at least one parameter specifying the reactive ambient.

Figure 2:
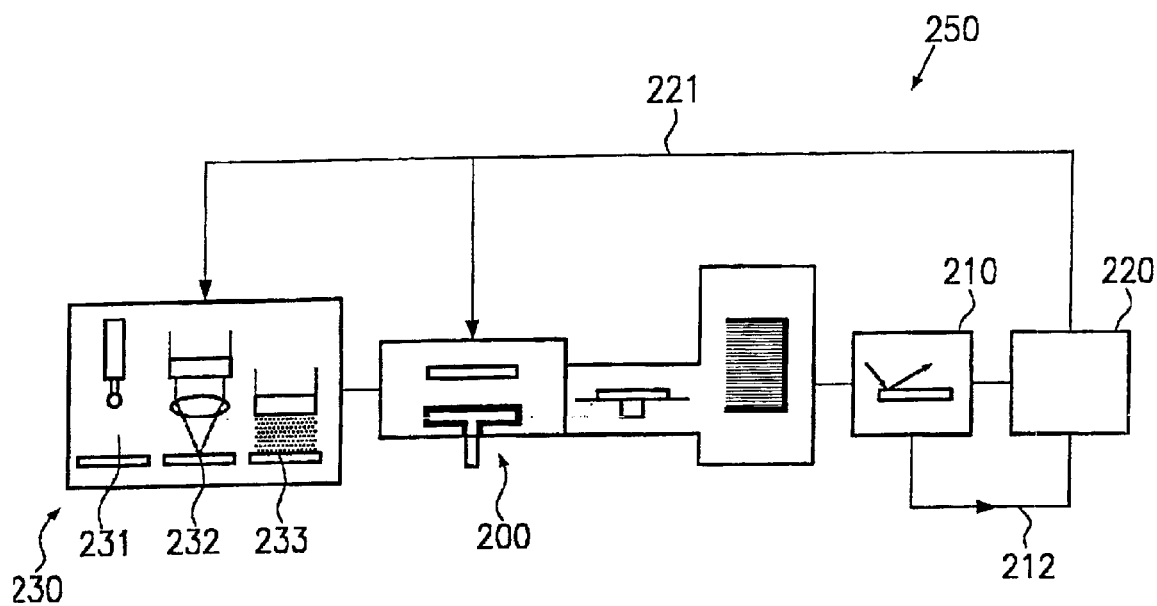
FIG. 2 schematically shows a further illustrative embodiment additionally comprising a photolithography tool.

With reference to FIG. 2, a further illustrative embodiment in accordance with the present invention will be described. In FIG. 2, a system 250 for controlling critical dimensions of features to be formed on a substrate comprises a photolithography tool 230 including a resist deposition station 231, an imaging station 232 and a developer station 233. The system 250 further comprises an etch tool 200, a measurement device 210 for obtaining characteristics of features formed on a substrate, a control unit 220 and a communication channel 221. The communication channel 221 allows communication of the control unit 220 with the photolithography tool 230, the etch tool 200 and the measurement device 210.

In operation, the characteristics of a photoresist pattern formed by the photolithography tool 230 is defined by a plurality of parameters, in the following commonly referred to as imaging parameters, that include parameters relating to the resist deposition station 231, the imaging station 232 and the developer station 233. For example, the imaging parameters may include at least some of the following parameters: type of photoresist, thickness of photoresist layer, type of material underlying the photoresist layer, type of anti-reflecting coating, wavelength of the imaging system, type of imaging system, time of exposure, type of developer, type and concentration of the developer used, time and temperature of post-exposure bake, and the like. Similarly, as in the embodiments described with reference to FIGS. 1a and 1b, the etch tool 200 establishes a parameter-specified reactive ambient to etch features in a substrate in accordance with the photoresist pattern generated by the photolithography tool 230. The measurement device 210, such as an ellipsometer, a scatterometer, a laser scanner or any other appropriate measurement device, is operatively coupled to the etch tool 200 to obtain characteristics of features prior to being processed in the etch tool 200 and/or after having been processed by the etch tool 200. The measurement device 210 supplies a detection signal via the communication channel 221 to the control unit 220, which, in turn, generates a control signal to adjust at least one of the parameters defining the reactive ambient and/or to adjust at least one of the imaging parameters controlling operation of the photolithography tool 230. Regarding the determination of the imaging parameters and/or the parameters specifying the reactive ambient, processing of the detection signal and generation of the control signal, the same criteria as explained with reference to the embodiments described with reference to FIGS. 1a and 1b also apply for the system 250.

In one illustrative embodiment, the communication channel 221 may be connected to an external source, such as an operator, a work station, or an FMS to indicate the actual status of the etch tool 200 and/or the photolithography tool 230, and/or the measurement device 210. Furthermore, instead of directly controlling at least one parameter value of the parameters specifying the reactive ambient and/or one of the imaging parameters, the external source may supply an external control signal or an enable signal to actually initiate adjusting of a specified parameter value by the control unit 220.

According to a further embodiment, the control unit 220 is configured as an interface between an external source and the system 250, wherein the detection signal generated in the measurement device 210 is communicated to the external source, where a corresponding control signal is generated on the basis of the detection signal in conformity with process requirements.

Figure 3:
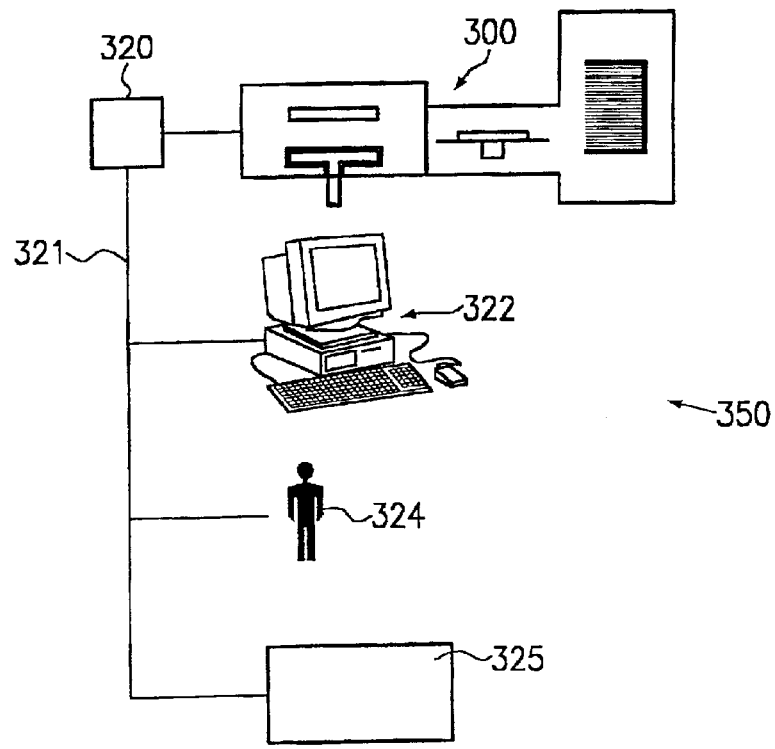
FIG. 3 schematically shows one illustrative embodiment in accordance with the present invention, in which a model based parameter value is used for controlling critical dimensions.

With reference to FIG. 3, a further embodiment of a system for controlling critical dimensions of features to be formed on a substrate will be described. In FIG. 3, a system 350 comprises an etch tool 300 adapted to establish a parameter-specified reactive ambient upon receipt of a control signal, wherein the detailed description of the etch tool 300 will be omitted for the sake of simplicity. A control unit 320 is coupled via a communication channel 321 to the etch tool 300 and further to an external source such as a work station 322 and/or an operator 324 and/or a facility management system 325. As is readily appreciated, the control unit 320 may be an integral part of the work station 322 or of the FMS 325. Moreover, the control unit 320 may be an integral part of a control circuitry (not shown) of the etch tool 300.

In operation, the control unit 320 generates the control signal on the basis of at least one model parameter value and communicates the control signal to the etch tool 300 to control the reactive ambient of etch tool 300. According to one illustrative embodiment, the at least one model parameter value is derived from a theoretical model of the etch process taking place in a parameter-specified ambient as provided in the etch tool 300. A corresponding etch model may output a respective set of parameter values for the etch parameter under consideration, wherein one or more of the individual parameter values are related to a specific substrate to be processed in the etch tool 300. For example, during progress of the etch process, a subtle variation of the reactive ambient may take place due to the deposition of byproducts generated during etching of previous substrates. As a consequence, the etch rate may vary and require a corresponding readjustment of the at least one etch parameter defining the reactive ambient so as to maintain the quality, i.e., the critical dimensions, of the features to be formed by the patterning process. Thus, a table of model parameter values may contain, in an ordered sequence, parameter values related to the time for which the reactive ambient has already been established and/or to the number of substrates that are still to be processed and/or to the number of substrates having already been processed and/or to the total number of substrates to be processed by the etch tool 300. For example, the etch time and/or the bias for each substrate to be processed in the etch tool 300 may be controlled in conformity with the individual parameter values and thus in conformity with the theoretical etch model to adjust the amount of material removed from the substrate on a single wafer basis. Hence, variations of the etch process on wafer "scale" may be minimized and critical dimensions are controlled to be within design specifications.

According to a further embodiment, the model parameter values of the at least one parameter may be derived from experiments, such as scatterometry measurements, previously performed on test substrates or product substrates. Corresponding measurement results will represent a profile of the at least one parameter with respect to time and/or with respect to number of wafers processed, which, in combination with the measurement results of critical dimensions of features formed on the test substrates or product substrates, for example obtained by SEM analysis, will allow to define appropriate model parameter values to minimize fluctuations of the critical dimensions within a lot of substrates. Particularly suitable parameters that may be adjusted by corresponding model parameter values are, for example, etch time of a single wafer and the bias of the etch tool 300.

In one illustrative embodiment, the measurement results by analyzing two or more substrates per lot, as in the prior art technique, may be entered into the control unit 320, in which a theoretical model of the etch process is continuously improved as the number of measurement results input into the control unit 320 increases with time. Thus, starting at an initial etch model, for example implemented as one or more look-up tables, the model parameter values will approach "optimum" values by "learning" about the effect of the presently used model parameter values on the critical dimensions. Consequently, when a desired accuracy of the model parameters is achieved, the number of external measurements may be drastically reduced or may even be become completely obsolete.

It should be noted that the measurements externally performed may allow assessment of critical dimensions at different locations on a substrate. Thus, the model parameter values may be selected to also compensate for process variations across the substrate surface, which may be of significant importance as the diameter of the substrates used in semiconductor fabrication is steadily increasing.

Figure 4:
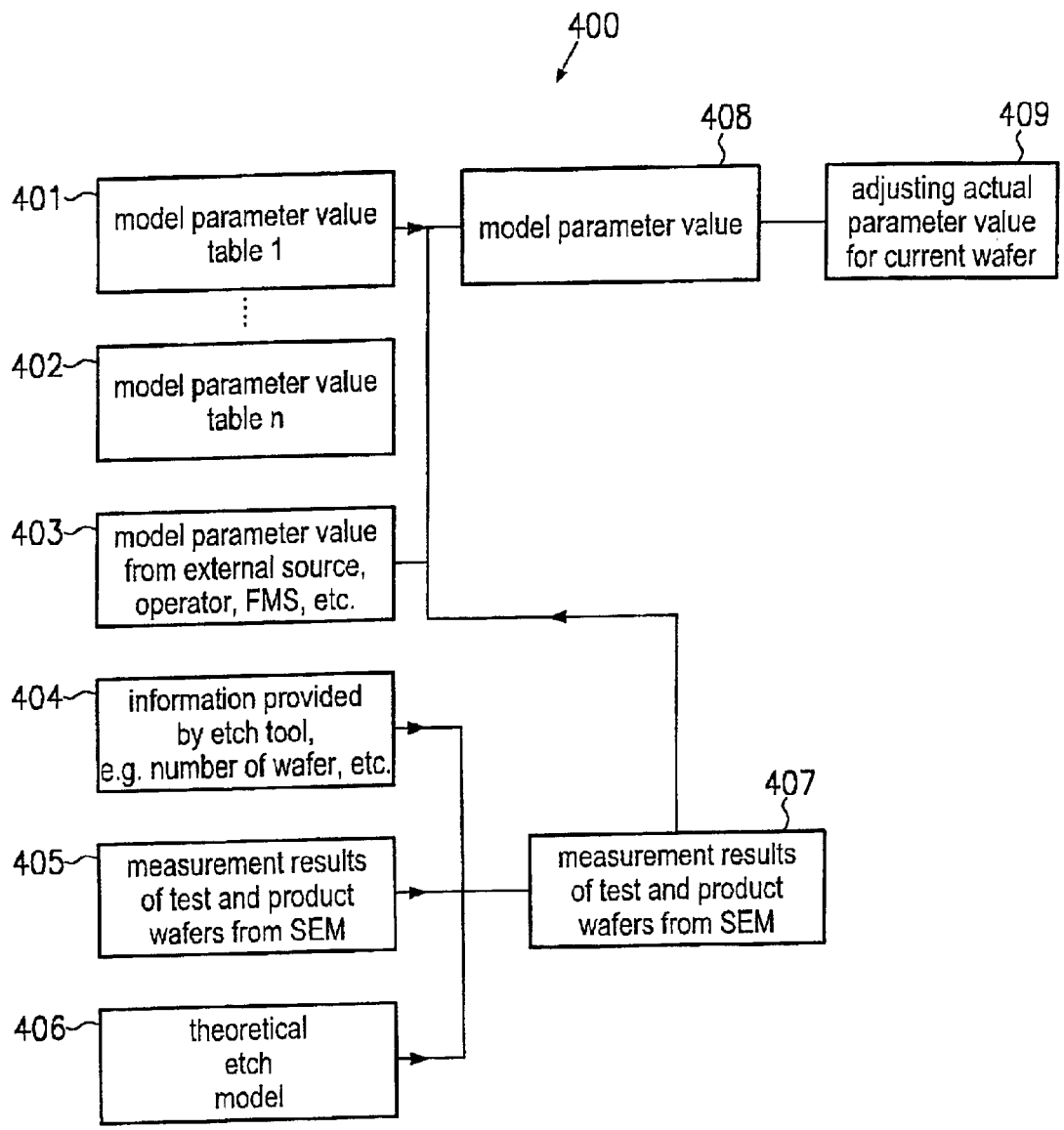
FIG. 4 depicts a flow chart showing a process flow as implemented in illustrative embodiments using a model based parameter value to control critical dimensions.

FIG. 4 shows a flow chart schematically depicting operational steps performed by the control unit 320 in accordance with illustrative embodiments of the present invention. In FIG. 4, reference number 400 represents a first table of model parameter values that may be established in accordance with theoretical etch process models and/or experimental analysis, as previously explained. In step 408, a specific candidate of the model parameter values is selected as the actual model parameter value, for example by advancing to the next table entry when the sequence of the entries represents the progression in time of the specific parameter, and in a step 409, the actual parameter value, i.e., the etch time, the bias, the flow rate, and the like, is adjusted to the model parameter value selected in step 408 to thereby control the reactive ambient of the etch tool 300 on a single wafer basis. As is indicated by step 402, a plurality of tables containing model parameter values for different parameters and/or different etch procedures may be implemented in the control unit 320 to alternatively or simultaneously vary a plurality of parameters determining the reactive ambient.

As indicted by step 403, according to a further illustrative embodiment, the model parameter values may be provided by an external source, such as an operator, an FMS and the like.

According to a further embodiment, the model parameter values may be generated within the control unit 320, for example, by a parameter evaluation portion (not shown) by calculating the model parameter values, as indicated by reference number 407, on the basis of a theoretical etch process model as indicated by step 406. In one particular embodiment, additional information is provided that is related to the etch tool, such as the current status of the etch tool, including information on pressure, flow rates of feed gases, the RF power, the actual temperature at the substrate and the like, the number of wafers having been processed, the number of wafers still to be processed, the time elapsed since the last maintenance of the etch tool, the time elapsed since the last tool malfunction, and the like. On the basis of this additional tool information, the theoretical etch process model is modified to adequately represent the current status of the etch tool. Subsequently, in step 408, a corresponding model parameter value is selected from the values calculated in step 407 and the actual parameter value of the etch tool 300 is adjusted in step 409 in accordance with the model parameter value selected in step 408.

In a further embodiment, measurement results of test and product wafers obtained by a measurement device, such as a scanning electron microscope, a scatterometer, an ellipsometer, a laser scanner, and the like, is entered into the parameter evaluation portion in step 405. The measurement results may be obtained by previously performed measurements and/or may continuously be updated by measurements carried out on a lot basis, as is the case in prior art systems and methods. The determination of the model parameter values may then be carried out on the basis of the measurement results obtained in step 405 to select a corresponding model parameter value in step 408 and to adjust the actual parameter value in step 409. According to one particular embodiment, the determination or the computation of the model parameter values in step 407 may be carried out on the basis of the theoretical etch process model 406 and/or the measurement results 405 of test and product wafers and/or information 404 provided by the etch tool, so as to obtain a maximum response of the system 300 to any fluctuations within a lot of substrates. It should be noted that the system 300 provides a control of the reactive etch ambient and therefore a control of the critical dimensions of features to be formed on the substrate on a single wafer basis, wherein an optimum match of the model parameter values to the actually obtained critical dimensions may be achieved by measurements performed on a lot basis. Moreover, the number of measurements carried out on a lot basis may be reduced, yet insuring an efficient control mechanism for critical dimensions for each substrate, thereby minimizing fluctuations within a lot and increasing overall throughput of the patterning process.

In a further embodiment, the system 300 may additionally comprise a photolithography tool, such as the photolithography tool 230 depicted in FIG. 2, which may be connected to the control unit 320 via the communication 321. As explained with reference to FIG. 2, the photolithography tool is controlled by a set of imaging parameters to form a photoresist pattern in conformance with process requirements. The theoretical etch process model established in step 406, or the model parameter tables 401 or 402, are then correspondingly adapted to take into account the characteristics of the photoresist pattern formed by the photolithography tool controlled by the imaging parameters. The model parameter value selected in step 408 is communicated to the etch tool 300 in step 409 to compensate for "intra" lot variations in both the photolithography tool and the etch tool 300. To this purpose, photolithography tool-related information is provided to the control unit 320 including information describing the current status of the photolithography tool and/or operational characteristics of the photolithography tool, obtained by experiment and/or by theory, with respect to a drift of the imaging parameters. For example, information reporting on a slight decrease of the exposure intensity of the photolithography tool due to an aging optical component may be entered into the process for establishing the model parameter value so that the continuous decrease of the intensity is compensated by the model parameter communicated to the etch tool 300.

According to a further embodiment, the etch tool 300 further comprises a measurement device (not shown in FIG. 3), such as an ellipsometer, a scatterometer, a laser scanner, and the like, that is suitably positioned to generate a detection signal representing characteristics of features formed on the substrate prior to being processed by the etch tool 300 and/or after having been processed by the etch tool 300. Measurement results of the measurement device, such as spectral distribution, polarization state, and the like, of a light beam scattered by the features formed on the substrate are communicated to the control unit 300 and/or to an external source where the measurements are analyzed and incorporated in the model parameter value tables or in a theoretical etch process model, for example, in the form weighting factors indicating the statistical relevance or the absolute magnitude of specific model parameter values. Since the measurement results represent additional information that is entered into the process of determining the model parameter values, the measurement values must not necessarily indicate the actual critical dimensions of the features under question, but, instead, may add further details regarding the patterning process, i.e., regarding the reactive ambient within the etch tool 300 and/or the status of the current substrate prior to being processed or after having been processed. For example, one or more predefined patterns on the substrate, such as especially designed test patterns or actual "product" patterns, may be measured by the measurement device, wherein the predefined patterns are designed to allow assessment of one or more parameter values defining the reactive ambient, wherein determination of the critical dimension, which, in general, requires the employment of quite sophisticated measurement tools and procedures, is not necessary. For instance, the height of a test feature may depend on the actual etch rate caused by the reactive ambient, which, in turn, may represent one parameter entered into the process of establishing the model parameter values for the next substrate to be processed. The height may, however, be determined from a feature having a critical dimension well above the critical dimensions to be controlled. Consequently, the resolving capability of the measuring device does not need to be in the range of the critical dimension to be created by the patterning process under consideration. Accordingly, available metrology tools may readily be adapted to be used in combination with the etch tool 300 in accordance with the present invention.

It is to be noted that although the embodiments described so far refer to a dry-etch tool, all of the above-explained embodiments may be modified to be implemented in a wet-etch tool. Since wet-etch tools providing a parameter-specified reactive ambient are well known in the art, a detailed description thereof is omitted.

As a result, the present invention provides systems and methods for enabling a controlled patterning process for features to be formed on a substrate, including features having minimum dimensions, wherein the process control occurs on a "fine scale" basis, for example, for each single substrate, or even for different locations (center region, edge region) on a single substrate, when more than one position on the substrate is considered by measurement and/or modeling, or when a plurality of different locations of different substrates is taken into account in determining the critical dimensions or in establishing model parameter values. The parameter values for determining the reactive ambient may then be selected so as to obtain an optimum averaged critical dimension across the entire substrate surface, which is particularly advantageous in processing large-area wafers. Contrary thereto, the prior art systems and methods allow control of critical dimensions only on a "large scale" basis, i.e., on a lot basis at most.

Due to the fine scale control of the present invention, the overall accuracy of the patterning process is significantly improved. The risk of processing substrates not meeting the process specifications is minimized, thereby saving time and resources. A real time monitoring of the patterning process may be obtained when a measurement device is integrated into the system, thereby remarkably reducing costs in case of a process tool malfunction that would otherwise only be detectable on a lot basis. Depending on the response time of the etch system, the present invention allows further to steadily update the etch model used for establishing the model parameter values, so that the short time accuracy, i.e., the fine scale accuracy, of the patterning system may be continuously improved. Upon arriving at a sufficient degree of accuracy, external measurements of critical dimensions by SEM may significantly be reduced in number or even be completely obsolete, which will additionally contribute to reduced cycle time and tool induced costs.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of controlling critical dimensions of features on a substrate, the method comprising:

providing an etch tool adapted to establish a parameter-specified reactive ambient;

providing a substrate having formed thereon a photoresist pattern in conformance with design requirements;

providing a measurement device adapted to determine characteristics of features formed on the substrate;

exposing the substrate to the parameter-specified reactive ambient;

measuring the substrate with said measurement device to obtain the feature characteristics of the features generated by exposing the substrate to the parameter-specified reactive ambient;

determining, at least on the basis of said obtained feature characteristics, at least one parameter to control the parameter-specified reactive ambient;

providing a substrate handling device; and measuring the substrate while being handled by said substrate handling device.

2. The method of claim 1, further comprising providing a test pattern at a specific location on the substrate, wherein the test pattern comprises feature lines and is configured to allow determination of at least one of spacing between adjacent feature lines, lateral extension of at least one feature line, height of at least one feature line, and angle of slope of side walls of at least one feature line.

3. The method of claim 1, further comprising measuring the photoresist pattern of the substrate prior to exposing the substrate to said parameter-specified reactive ambient to obtain pattern characteristics of said photoresist pattern.

4. The method of claim 3, wherein determining of the at least one parameter to control the parameter-specified reactive ambient is determined on the basis of said pattern characteristics and said feature characteristics.

5. The method of claim 1, further comprising additionally determining the at least one parameter to control the parameter-specified reactive ambient on the basis of model parameter values.

6. The method of claim 5, further comprising updating the model parameter values according to information provided by the measurement device.

7. The method of claim 5, further comprising calculating said model parameter values on the basis of at least one of design values of the features to be formed on the substrate, etch tool characteristics, substrate characteristics, photolithographical characteristics used for forming said photoresist pattern, number of substrate to be processed by the etch tool, and number of substrates having been processed by the etch tool.

8. The method of claim 7, wherein said etch tool characteristics include at least one of dimensions of a process chamber establishing said parameter-specified reactive ambient, electrode spacing, available bias range of the electrodes, type of reactive gases supplied to the etch tool, and available range of flow rate.

9. The method of claim 5, wherein said model parameter values are provided by an external source.

10. The method of claim 9, wherein said external source is at least one of an operator, a work station and a facility management system.

11. The method of claim 1, wherein measuring said substrate comprises directing a light beam of predefined optical characteristics onto the substrate; and receiving a light beam scattered by the substrate and bearing information relating to features formed on the substrate.

12. The method of claim 11, further comprising generating a control signal in response to the received scattered light beam, wherein the control signal is indicative for at least one parameter of the parameter-specified reactive ambient.

13. The method of claim 12, wherein the control signal is communicated to at least one of an operator and a control unit connected to the etch tool.

14. The method of claim 12, further comprising comparing the optical characteristics of the received scattered light beam to reference characteristics.

15. The method of claim 14, wherein the reference characteristics include at least one of polarization state, total intensity, and spectral intensity.

16. The method of claim 14, further comprising calculating said reference characteristics on the basis of the optical characteristics of the output beam of the measurement device and design values of the features to be formed on the substrate.

17. The method of claim 14, wherein the reference characteristics are stored as reference data in a memory.

18. A method of controlling critical dimensions of features on a substrate, the method comprising:

providing an etch tool adapted to establish a parameter-specified reactive ambient in response to a control signal;

providing a substrate having formed thereon a photoresist pattern in conformance with design requirements;

providing a substrate handling device;

providing a measurement device adapted to determine characteristics of features formed on the substrate;

providing a control unit operatively coupled to the etch tool to control operation of the etch tool;

measuring the substrate while being handled by said substrate handling device to obtain measured characteristics of the features formed on the substrate;

determining at least one parameter value for the parameter-specified reactive ambient on the basis of at least one model parameter value that is obtained based upon at least the measured characteristics of the features formed on the substrate;

communicating the determined at least one parameter value to the control unit to generate said control signal; and exposing the substrate to the parameter-specified reactive ambient; wherein the control unit controls the parameter-specified reactive ambient in accordance with the determined at least one parameter value.

19. The method of claim 18, further comprising:

receiving etch process-related information describing at least one of characteristics of the etch tool;

relating at least one characteristic contained in the etch process-related information to at least one parameter value of the etch tool to define said at least one model parameter value; and communicating said at least one parameter value to the control unit.

20. The method of claim 18, further comprising determining the model parameter values on the basis of an etch process model including at least one of design values of the features to be formed on the substrate, etch tool information, substrate characteristics, photolithographical characteristics used for forming said photoresist pattern, number of substrate to processed by the etch tool, and number of substrates having been processed by the etch tool.

21. The method of claim 20, wherein said at least one parameter value is at least one of etch time, bias, and flow rate of gases supplied to the etch tool.

22. The method of claim of 21, wherein the model parameter values are updated on the basis of the etch process-related information.

23. The method of claim 22, wherein the etch process-related information contains substrate specific statistical information.

24. The method of claim 23, wherein the substrate specific statistical information relates to process characteristics at different locations on a substrate.

25. A method of controlling critical dimensions of features on a substrate, the method comprising:

providing an etch tool adapted to establish a parameter-specified reactive ambient;

providing a substrate having formed thereon a photoresist pattern in conformance with design requirements;

providing a measurement device adapted to determine characteristics of features formed on the substrate;

exposing the substrate to the parameter-specified reactive ambient;

measuring the substrate with said measurement device to obtain the feature characteristics of the features generated by exposing the substrate to the parameter-specified reactive ambient;

determining, at least on the basis of said obtained feature characteristics, at least one parameter to control the parameter-specified reactive ambient; and providing a test pattern at a specific location on the substrate, wherein the test pattern comprises feature lines and is configured to allow determination of at least one of spacing between adjacent feature lines, lateral extension of at least one feature line, height of at least one feature line, and angle of slope of side walls of at least one feature line.

26. The method of claim 25, further comprising directing a light beam of predefined optical characteristics onto the test pattern and receiving a light beam scattered by the test pattern and bearing information relating to the features formed on the test pattern.

27. The method of claim 25, further comprising measuring the photoresist pattern of the substrate prior to exposing the substrate to said parameter-specified reactive ambient to obtain pattern characteristics of said photoresist pattern.

28. The method of claim 27, wherein determining of the at least one parameter to control the parameter-specified reactive ambient is determined on the basis of said pattern characteristics and said feature characteristics.

29. The method of claim 25, wherein measuring said substrate comprises directing a light beam of predefined optical characteristics onto the substrate; and receiving a light beam scattered by the substrate and bearing information relating to features formed on the substrate.

30. The method of claim 29, further comprising generating a control signal in response to the received scattered light beam, wherein the control signal is indicative for at least one parameter of the parameter-specified reactive ambient.

31. The method of claim 30, wherein the control signal is communicated to at least one of an operator and a control unit connected to the etch tool.

32. The method of claim 30, further comprising comparing the optical characteristics of the received scattered light beam to reference characteristics.

33. The method of claim 32, wherein the reference characteristics include at least one of polarization state, total intensity, and spectral intensity.

34. The method of claim 32, further comprising calculating said reference characteristics on the basis of the optical characteristics of the output beam of the measurement device and design values of the features to be formed on the substrate.

35. The method of claim 32, wherein the reference characteristics are stored as reference data in a memory.

36. The method of claim 25, further comprising additionally determining the at least one parameter to control the parameter-specified reactive ambient on the basis of model parameter values.

37. The method of claim 36, further comprising updating the model parameter values according to information provided by the measurement device.

38. The method of claim 36, further comprising calculating said model parameter values on the basis of at least one of design values of the features to be formed on the substrate, etch tool characteristics, substrate characteristics, photolithographical characteristics used for forming said photoresist pattern, number of substrate to be processed by the etch tool, and number of substrates having been processed by the etch tool.

39. The method of claim 38, wherein said etch tool characteristics include at least one of dimensions of a process chamber establishing said parameter-specified reactive ambient, electrode spacing, available bias range of the electrodes, type of reactive gases supplied to the etch tool, and available range of flow rate.

40. The method of claim 36, wherein said model parameter values are provided by an external source.

41. The method of claim 40, wherein said external source is at least one of an operator, a work station and a facility management system.

* * * * *